United States Patent
Wu et al.

(10) Patent No.: US 6,398,033 B1
(45) Date of Patent: Jun. 4, 2002

(54) WAFER CONTAINER WITH RETRACTABLE HANDLE

(75) Inventors: Tzong-Ming Wu, Taipei; Tien-Lu Ho, Da-Li; Jen-Rong Huang, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/645,039

(22) Filed: Aug. 24, 2000

(30) Foreign Application Priority Data

Jun. 16, 2000 (TW) ..................... 089210269 U

(51) Int. Cl.⁷ ............................. B65D 85/30
(52) U.S. Cl. .................. 206/711; 206/710; 16/418; 220/761
(58) Field of Search ............... 206/710, 711, 206/712; 220/762, 763, 764, 757, 759, 761, 772; 16/112, 22.6, 342, 337, 444, 445, 418

(56) References Cited

U.S. PATENT DOCUMENTS

| | | | | |
|---|---|---|---|---|
| 3,924,775 A | * | 12/1975 | Andreaggi et al. | ........... 220/96 |
| 4,157,763 A | * | 6/1979 | Betlejewski et al. | ........ 220/761 |
| 5,012,553 A | * | 5/1991 | Hardigg et al. | ............... 16/326 |
| 5,226,553 A | * | 7/1993 | Fiore | ........................... 220/318 |
| 5,390,972 A | * | 2/1995 | Galloway | ................... 294/27.1 |
| 5,461,755 A | * | 10/1995 | Hardigg et al. | ............... 16/112 |
| 5,718,350 A | * | 2/1998 | Williams | .................... 220/326 |
| 5,788,082 A | | 8/1998 | Nyseth | |
| 5,823,593 A | * | 10/1998 | Glicket et al. | ............. 294/27.1 |
| 5,944,194 A | | 8/1999 | Gregerson et al. | |
| 6,048,125 A | * | 4/2000 | Droche et al. | ................. 403/12 |
| 6,076,233 A | * | 6/2000 | Sasaki et al. | ................. 16/444 |
| 6,230,925 B1 | * | 5/2001 | Hardigg et al. | ............. 220/761 |

* cited by examiner

Primary Examiner—Mickey Yu
Assistant Examiner—Jila M Mohandesi
(74) Attorney, Agent, or Firm—Rabin & Berdo, P.C.

(57) ABSTRACT

A wafer container is constructed to include a shell, a holder frame, two retaining blocks, and a handle. The shell has a coupling unit at the periphery. The retaining blocks are fastened to the holder frame, forming first pivot structure. The handle is provided with second pivot structure adapted for coupling to the first pivot structure for enabling the handle to be turned relative to the holder frame through an angle between the operative position convenient for carrying by hand, and the collapsed, non-operative position to minimize space occupation.

12 Claims, 5 Drawing Sheets

WAFER CONTAINER WITH RETRACTABLE HANDLE

BACKGROUND OF THE INVENTION

1. Field of The Invention

The present invention relates to wafer containers adapted for carrying wafers, and more particularly to wafer containers, which have retractable handle structure convenient for carrying by hands.

2. Description of Related Art

Regular wafer containers may be designed for carrying by hand or using a mechanical arm. U.S. Pat. No. 5,788,082 and U.S. Pat. No. 5,944,194 disclose wafer container handles convenient for carrying by hands. Because the handles protrude from the periphery of the wafer container at two opposite sides at a distance, much floor space is required when arranging multiple wafer containers in parallel in a clean room.

SUMMARY OF THE INVENTION

It is the main object of the present invention to provide wafer containers with retractable handles, so that such wafer containers can be arranged in a smaller space.

It is another object of the present invention to provide wafer containers with retractable handles which are detachable, and easily made up.

To achieve these and other objects of the present invention, there is provided a wafer container, which comprises a shell having at least one coupling unit at the periphery thereof, a holder frame adapted for coupling to the coupling unit of the shell, at least one retaining block adapted for fastening to the holder frame to form a first pivot structure, and at least one handle adapted for coupling to the first pivot structure. The handle is provided with a second pivot structure adapted for coupling to the first pivot structure for enabling the handle to be respectively turned relative to the holder frame through an angle between the operative position and the collapsed, non-operative position.

The holder frame, the retaining block, the handle and the shell can be separately made and then coupled to one another.

Alternatively, the holder frame and the retaining block can be made into a whole, and then coupled to the shell to hold the handle. The retaining block can be fastened to a respective coupling groove at the holder frame by press-fitting, hook means, snap means, screw means, or any equipment fastening means.

First and second positioning means may be provided to hold the handle between the operative position and the non-operative position. The first pivot structure an d the second pivot structure can be pivot holes and pivot axles, through holes and pins, or any other equivalent coupling structure that enables the handle to be turned relative to the holder frame.

DETAILED DESCRIPTION OF THE PREFERRED EMBODIMENT

Figure 1:
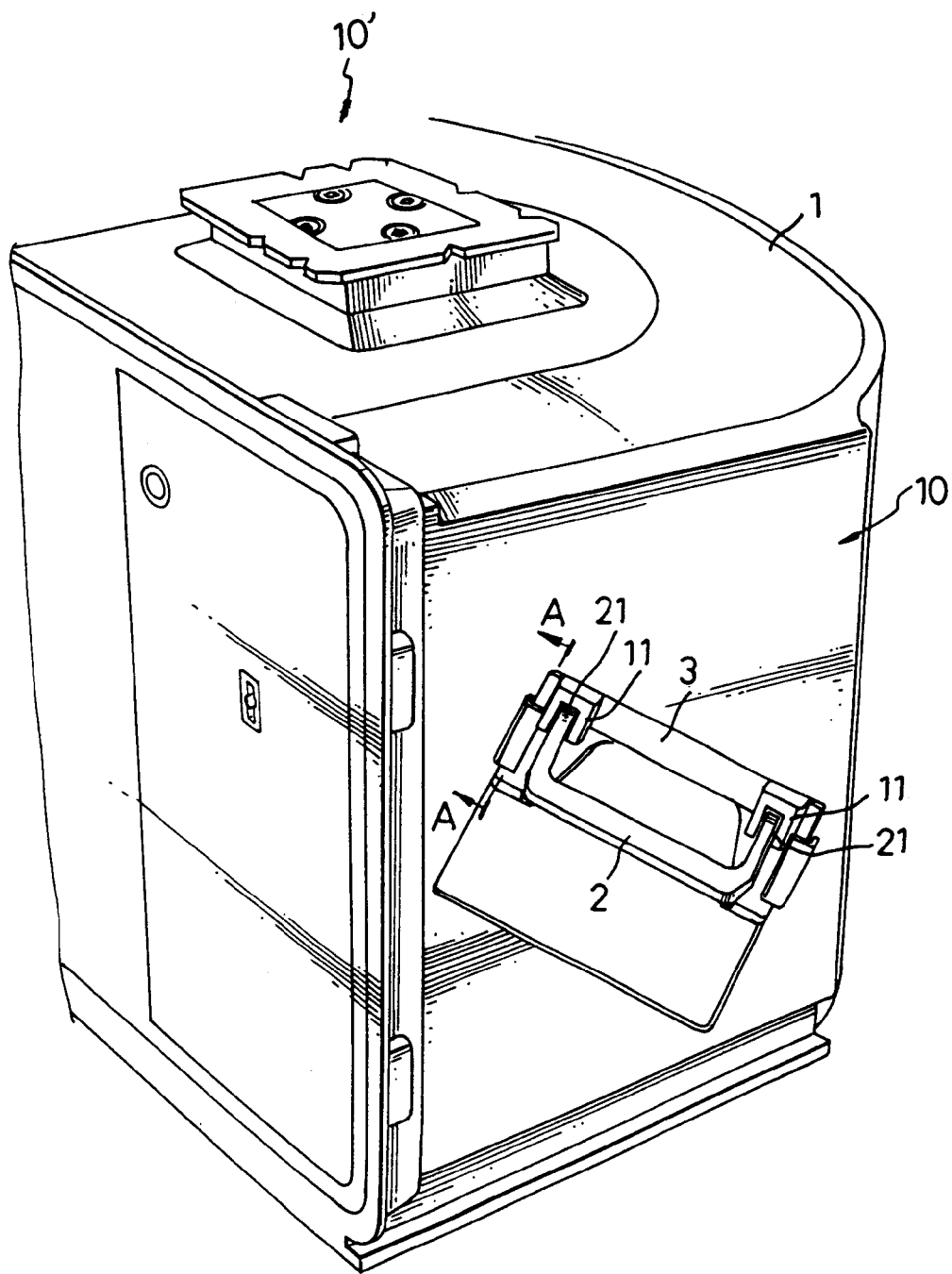
FIG. 1 is a perspective view of a wafer container constructed according to the present invention.

Referring to FIG. 1, at each of two sidewalls 10 and 10' of the shell 1 of a wafer container, there is provided a handle holder. The two handle holders may be respectively formed integral with the sidewalls 10 and 10'. According to the present preferred embodiment, the handle holders, referenced by 3, are made retractable.

Figure 2:
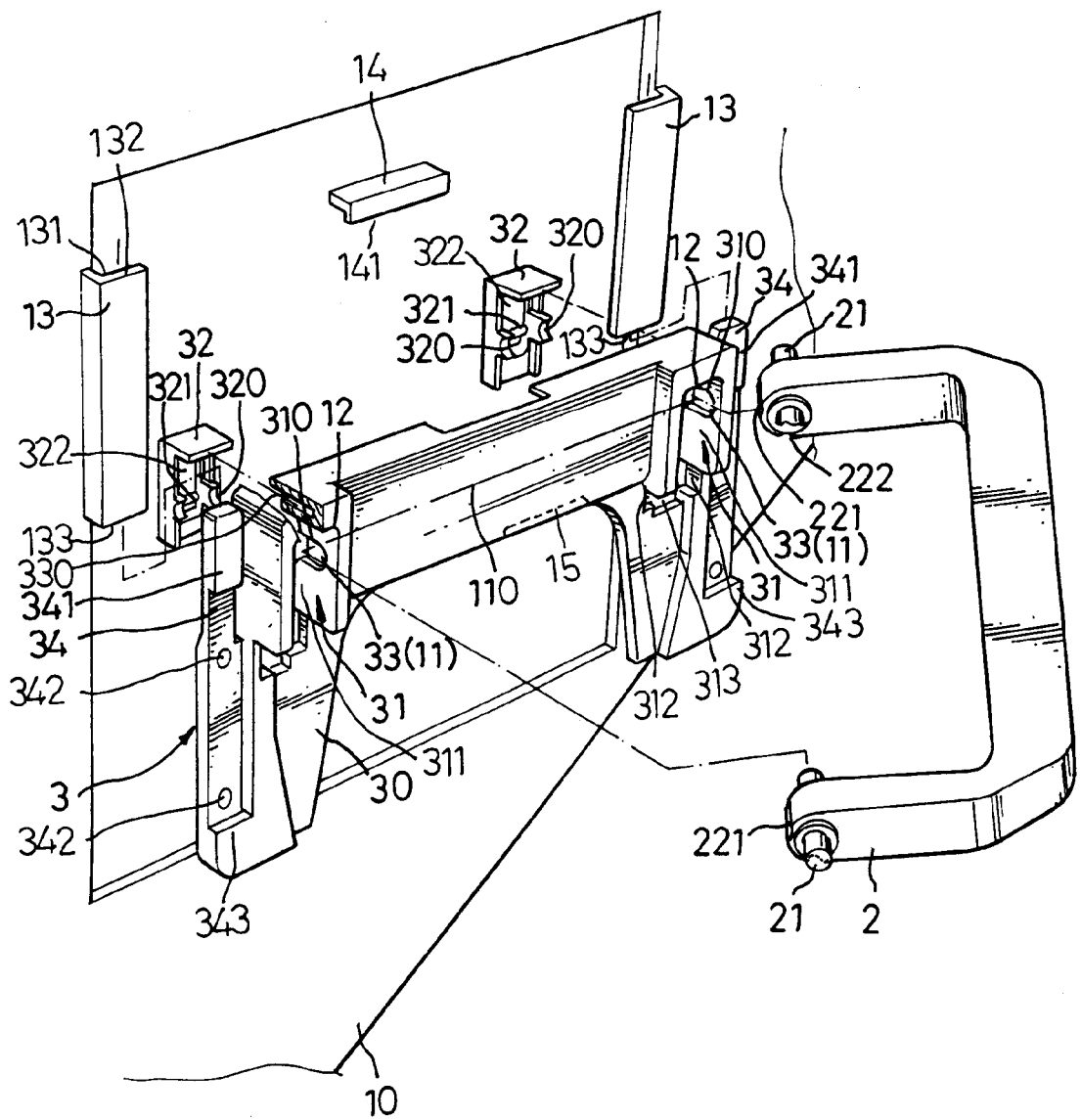
FIG. 2 is an exploded view of the present invention.

Referring to FIG. 2 and FIG. 1 again, each retractable handle holder 3 forms with a handle 2 a retractable operation handle. The handle holder 3 comprises holder frame 30, and two retaining blocks 32. During the assembly process, the handle 2 is put in the holder frame 30, and then the retaining blocks 32 are inserted into the holder frame 30, and then the holder frame 30 is coupled to the shell 1, enabling two distal ends of the handle 2 to be respectively pivoted to the handle holder 3. Alternatively, the holder frame and the retaining blocks can be integrally made and then coupled to the shell. The holder frame 30 is a substantially U-shaped member comprising two openings 31 at two opposite ends, each opening 31 having a middle hole 311 adapted to receive the retaining blocks 32 and the ends of the handle 2, two symmetrical pairs of recessed portions 312 respectively bilaterally disposed in the openings 31, two notches 313 respectively disposed in the openings 31 at a bottom side, and two symmetrical pairs of semicircular long grooves 310 respectively bilaterally disposed in the openings near a rear side remote from the notches 313. The semicircular long grooves 310 each have a smoothly arched inner end. The retaining blocks 32 fit the openings 31, and are respectively inserted into the openings 31 from a back side. Each retaining block 30 comprises two arches 320 adapted for inserting into the semicircular long grooves 310, and a resilient plate 322. The resilient plate 322 has a rib 321. The arches 320 each have a notched front end. When press-fitting the retaining blocks 32 in a respective surround groove 330 at the back side wall of the holder frame 30 around each opening 31, the notched front end of each arch 320 forms with the smoothly arched inner end of the corresponding groove 310 a first pivot structure 11. According to the present preferred embodiment, the first pivot structure 11 is a pivot hole 33.

The handle 2 is a substantially U-shaped member having two pivot structures, namely, pivot axles 21 disposed at two distal ends thereof. Before the installation of the retaining blocks 32, the pivot axles 21 are inserted with the two distal ends of the handle 2 through the recessed portions 312 and notches 313 of the openings 31 from the front side of the holder frame 30 to the back side thereof, and then the handle 2 is moved upwards and then forwards, enabling the pivot axles 21 to be respectively moved into the grooves 310 and respectively stopped at the smoothly arched inner end of each groove 310. Then the retaining blocks 32 are respectively press-fitted into the respective surround grooves 330 to hold the pivot axles 21 of the handle 2 in the respective pivot holes 33. After installation of the retaining blocks 32 in the holder frame 30, the back side wall of the holder frame 30 and the back side wall of each retaining block 32 are flush for mounting on one side wall 10 of the shell 1. The pivot axles 21 form a revolving shaft 110 disposed in parallel to the sidewall 10 of the shell 1 and rotatable in the pivot holes 33. By means of the aforesaid arrangement, the handle 2 is pivoted to the handle holder 3. After installation of the handle 2 and the retaining blocks 32 in the handle holder 3, two protruded resilient plates 34 of the holder frame 30 are respectively coupled to a pivot structure at the sidewall 10 of the shell 1. According to the present preferred embodiment, the pivot structure at the sidewall 10 of the shell 1 is comprised of two parallel lugs 13 facing each other. The lugs 13 each define a long coupling groove 131. When inserting the resilient plates 34 of the holder frame 30 into the coupling grooves 131, a short back coupling groove 15 of the holder frame 30 is forced into engagement with a short coupling lug 14, which is provided at the sidewall 10 of the shell 1 between the lugs 13. By means of the aforesaid arrangement, the handle 2 can be easily detachably installed in one sidewall 10 of the shell 1 without the use of screws or fastening elements.

Figure 3:
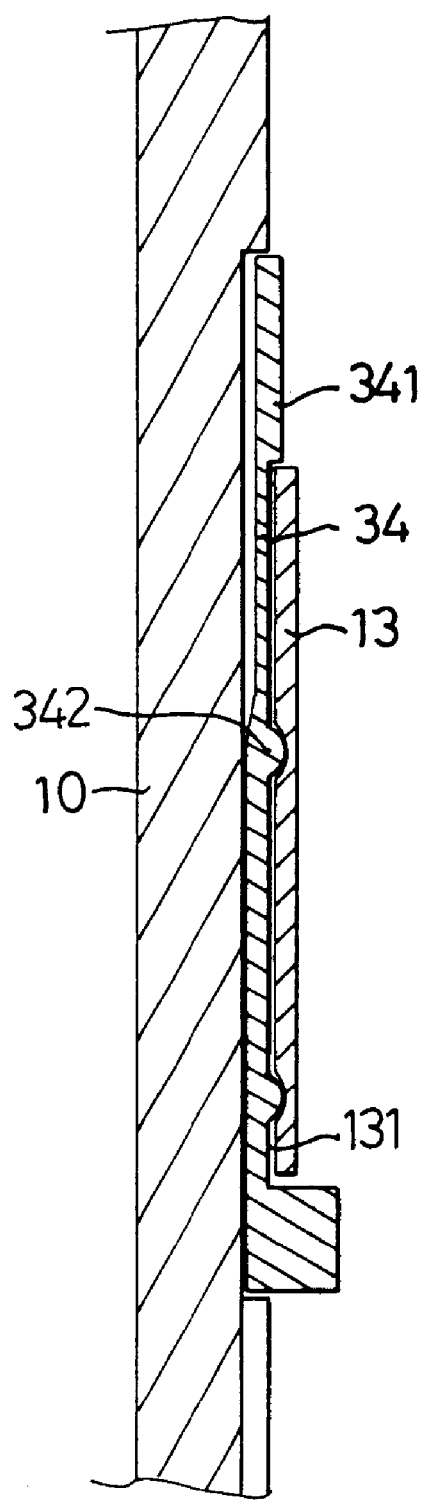
FIG. 3 is a section view in an enlarged scale taken along line A—A of FIG. 1.

Referring to FIG. 3 and FIG. 2 again, the resilient plates 34 of the holder frame 30 each have free end terminating in a hooked portion 341 and a raised portion 342 on the middle. After coupling of the resilient plates 34 and coupling groove 15 of the holder frame 30 to the respectively coupling grooves 131 and short coupling lug 14 of the shell 1, the hooked portions 341 of the resilient plates 34 are respectively hooked up with the top end 132 of each lug 13.

Figure 4:
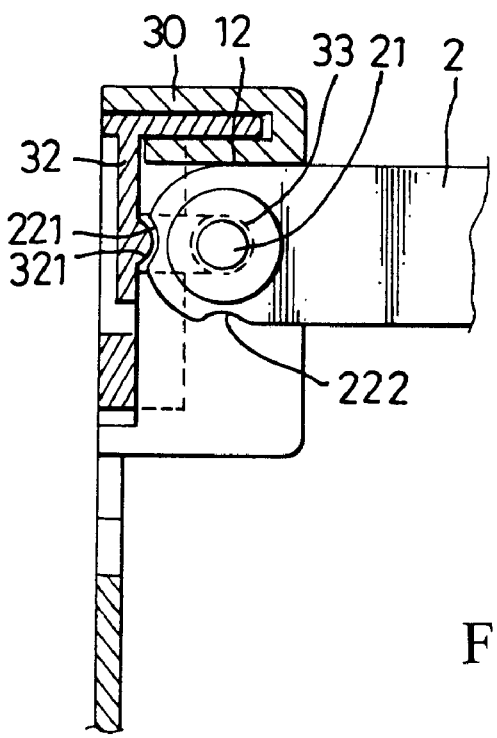
FIG. 4 is a section view showing the handle set in the first position according to the present invention.

Referring to FIG. 4, when wishing to carry the shell 1, the handle 2 is turned outwards from the holder frame 30 to the first position shown in FIG. 4 convenient for carrying with the hand. At this time, the first locating groove, referenced by 221, at each end of the handle 2 is respectively forced into engagement with the rib 321 at the resilient plate 322 of each retaining block 32, keeping the handle 2 positively held in the first position. At the same time, two protruding portions 343 and the coupling strip 15 of the holder frame 30 are respectively stopped at the bottom end 133 of each lug 13 and the bottom end 141 of the short coupling lug 14, enabling the shell 1 to be conveniently carried by hand.

Figure 5:
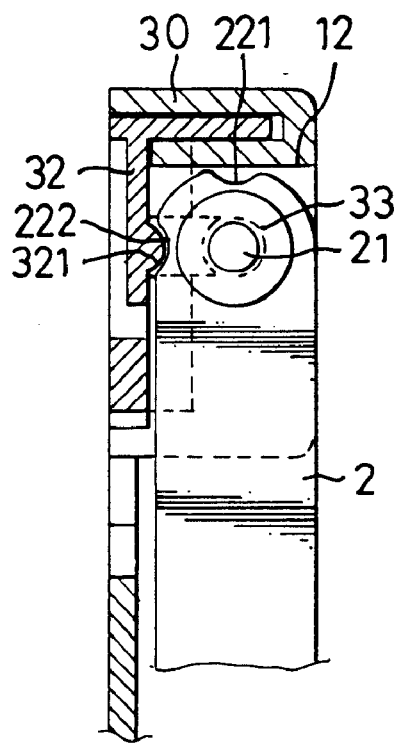
FIG. 5 is a section view showing the handle set in the second position according to the present invention.

Referring to FIG. 5, when not in use, the handle 2 is turned downwards to the second position shown in FIG. 5 and closely attached to the sidewall 10 of the shell 1. At this time, the second locating groove 222 at each end of the handle 2 is respectively forced into engagement with the rib 321 at the resilient plate 322 of each retaining block 32, keeping the handle 2 positively held in the second position.

Figure 6:
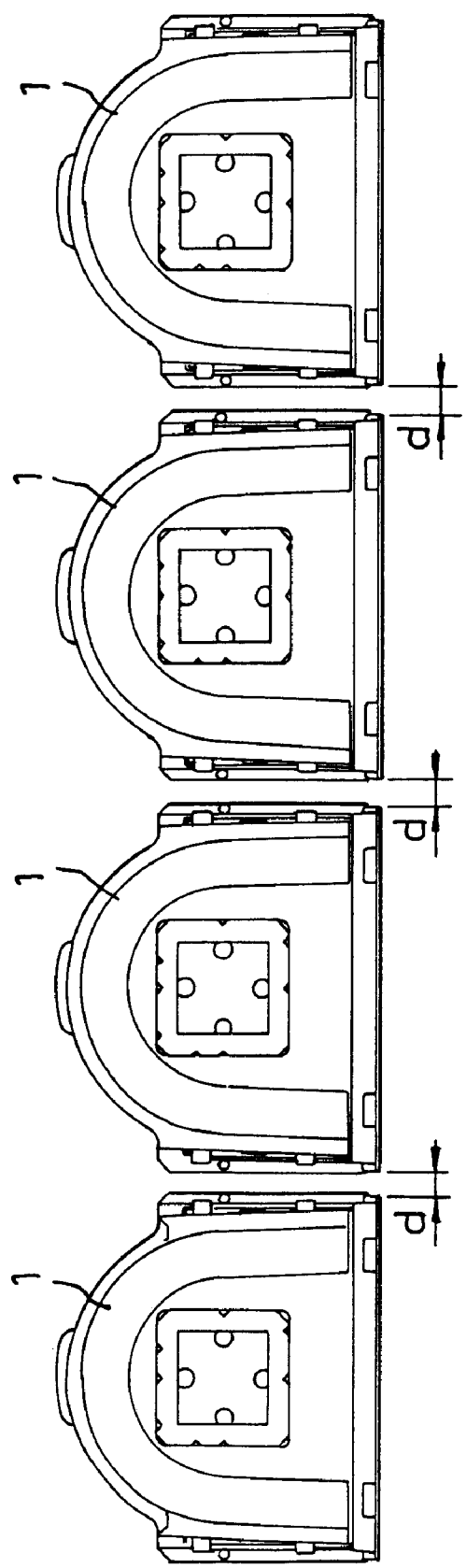
FIG. 6 shows multiple wafer containers arranged in a line according to the present invention.

Referring to FIG. 6, when several container bodies 1 (wafer containers) are put together in a line, less floor space is required. Because the handle 2 of each wafer container is set in the second position, the distance d between each two adjacent container bodies 1 is minimized, and many wafer containers can be stored in a limited storage space.

It is to be understood that the drawings are designed for purposes of illustration only, and are not intended for use as a definition of the limits and scope of the invention disclosed.

What is claimed is:

1. A wafer container, comprising:

a shell having a sidewall and at least two lugs disposed on the sidewall, each lug defining with the sidewall a respective long coupling groove;

a holder frame having two resilient plates, each having a free end terminating in a hooked portion, each resilient plate being receivable within a respective one of the long coupling grooves, each hooked portion engaging with the respective lug to retain the respective resilient plate within the respective long coupling groove;

at least one retaining block fastenable to said holder frame to form a first pivot means; and at least one handle having a second pivot means couplable to said first pivot means, said first pivot means and said second pivot means being for enabling said handle to be turned relative to said holder frame through an angle.

2. The wafer container of claim 1, wherein said holder frame, said retaining block, said handle and said shell are separate devices.

3. The wafer container of claim 1, wherein said holder frame and said retainer block are integrally formed.

4. The wafer container of claim 1, wherein said holder frame has two openings at two opposite ends thereof, wherein said first pivot means includes two pairs of semi-circular long grooves respectively bilaterally disposed in the openings, and wherein said at least one retaining block includes two retaining blocks, each being fastened to said holder frame at a respective opening.

5. The wafer container of claim 4, wherein said first pivot means further includes two arches formed on each of said retaining blocks, each said arch being in registration with a respective one of the semicircular long grooves.

6. The wafer container of claim 1, wherein said holder frame comprises at least one surround groove adapted to receive said retaining block.

7. The wafer container of claim 1, wherein said holder frame comprises two protruding portions, each being disposed at a base of a respective resilient plate, and each abutting against a bottom of a respective lug when said resilient plates are disposed within the respective long coupling grooves.

8. The wafer container of claim 1, wherein said first pivot means includes at least one pivot hole formed between said retaining block and said holder frame when said retaining block is fastened to said holder frame.

9. The wafer container of claim 1, wherein said second pivot means comprises at least one pivot axle disposed at a distal end of said handle.

10. The wafer container of claim 1, further comprising first positioning means for holding said handle in a first position when said handle is coupled to said holder frame.

11. The wafer container of claim 10, further comprising second positioning means for holding said handle in a second position when said handle is coupled to said holder frame.

12. The wafer container of claim 1, wherein said holder frame has a coupling groove, and said shell further comprises a coupling lug on said sidewall and being receivable within the coupling groove.

* * * * *